(12) United States Patent
Huang et al.

(10) Patent No.: US 12,327,597 B2
(45) Date of Patent: Jun. 10, 2025

(54) SMALL-AREA COMMON-VOLTAGE ANTI-FUSE ARRAY

(71) Applicant: YIELD MICROELECTRONICS CORP., Hsin-Chu County (TW)

(72) Inventors: Yu-Ting Huang, Hsin-Chu County (TW); Chi-Pei Wu, Hsin-Chu County (TW)

(73) Assignee: Yield Microelectronics Corp., Chu-Pei (TW)

( * ) Notice: Subject to any disclaimer, the term of this patent is extended or adjusted under 35 U.S.C. 154(b) by 149 days.

(21) Appl. No.: 18/480,743

(22) Filed: Oct. 4, 2023

(65) Prior Publication Data

US 2025/0014660 A1   Jan. 9, 2025

(30) Foreign Application Priority Data

Jul. 6, 2023   (TW) ................... 112125175

(51) Int. Cl.
*G11C 17/16* (2006.01)
*G11C 8/08* (2006.01)
*G11C 17/18* (2006.01)
*H01L 23/525* (2006.01)
*H10B 20/25* (2023.01)

(52) U.S. Cl.
CPC ........... *G11C 17/16* (2013.01); *G11C 8/08* (2013.01); *G11C 17/18* (2013.01); *H01L 23/5252* (2013.01); *H10B 20/25* (2023.02)

(58) Field of Classification Search
CPC .................. H10B 2/25; G11C 17/16
USPC ....................................... 365/96
See application file for complete search history.

(56) References Cited

U.S. PATENT DOCUMENTS

| | | | |
|---|---|---|---|
| 5,282,158 A | 1/1994 | Lee | |
| 2004/0151024 A1* | 8/2004 | Fricke | H10B 63/20 365/177 |
| 2005/0282158 A1 | 12/2005 | Landegren | |
| 2008/0117661 A1 | 5/2008 | Holtzclaw et al. | |
| 2013/0051150 A1* | 2/2013 | Roizin | G11C 16/3418 365/185.18 |
| 2023/0146353 A1* | 5/2023 | Or-Bach | H01L 23/5283 257/324 |

OTHER PUBLICATIONS

First Examination Report mailed to Taiwanese Counterpart Patent Application No. 112125175 dated May 3, 2024.

\* cited by examiner

*Primary Examiner* — Muna A Techane
(74) *Attorney, Agent, or Firm* — Rosenberg, Klein & Lee

(57) ABSTRACT

A small-area common-voltage anti-fuse array includes word lines, select lines, common-voltage lines, and anti-fuse elements. The word lines include a first word line and a second word line. The select lines are perpendicular to the common-voltage lines and the word lines. The select lines include a first select line. The common-voltage lines are directly coupled together. The common-voltage lines include a first common-voltage line and a second common-voltage line. Each anti-fuse element includes a first anti-fuse memory cell coupled to the first word line, the first select line, and the first common-voltage line and a second anti-fuse memory cell coupled to the second word line, the first select line, and the second common-voltage line.

24 Claims, 6 Drawing Sheets

SMALL-AREA COMMON-VOLTAGE ANTI-FUSE ARRAY

This application claims priority for the TW patent application No. 112125175 filed on 6 Jul. 2023, the content of which is incorporated by reference in its entirely.

BACKGROUND OF THE INVENTION

Field of the Invention

The present invention relates to a memory array, particularly to a small-area common-voltage anti-fuse array.

Description of the Related Art

The data of non-volatile memories, including EEPROM and flash memories, are electrically editable and erasable and will not vanish after power is turned off. Therefore, they are extensively used by information and computer industry. However, these read-only-memory and cache memories have complicated structure, low reliability and high fabrication cost. Therefore, the high-reliability and low-cost one-time programmable (OTP) memories are also often used in many situations. The OTP memories are characterized in using fuses and anti-fuses as elements and having high flexibility in application.

The fuses used currently include metal fuses and poly fuses. Using a high energy laser beam or a great current to burn out fuses is the primary writing method of OTP memories. After writing, the resistance the fuse increases, and the power consumption rises. In an anti-fuse, a dielectric layer is interposed between two conductors to form a capacitor. In writing, bias is applied to two conductors to induce breakdown and puncture of the dielectric layer. After writing, the resistance of the anti-fuse decreases. Integrated circuit is developing very fast, and the size thereof is growing smaller and smaller. The technology of using MOS elements to fabricate anti-fuse elements has been developed in recent years, wherein the breakdown mechanism of gate dielectric layers is the primary writing method thereof. The anti-fuse is a programmable element. When programming, its internal switches will be turned off or turned on. In order to program the anti-fuse array, a certain voltage and current need to be applied, so that the corresponding switches can be turned on or off. These programming signals need to pass through the decoder to be transmitted to the correct position of the anti-fuse array. However, the decoder increases the overall area of the anti-fuse array.

To overcome the abovementioned problems, the present invention provides a small-area common-voltage anti-fuse array, so as to solve the afore-mentioned problems of the prior art.

SUMMARY OF THE INVENTION

The present invention provides a small-area common-voltage anti-fuse array, which reduces the number and the overall area of decoders.

In an embodiment of the present invention, a small-area common-voltage anti-fuse array is provided. The small-area common-voltage anti-fuse array includes a plurality of word lines, a plurality of select lines, a plurality of common-voltage lines, and a plurality of anti-fuse elements. The word lines, arranged in parallel, include a first word line and a second word line. The select lines, which are arranged in parallel and perpendicular to the word lines, include a first select line. The common-voltage lines are arranged in parallel. The common-voltage lines perpendicular to the select lines are directly coupled together. The common-voltage lines include a first common-voltage line and a second common-voltage line. The first word line and the second word line are respectively close to the first common-voltage line and the second common-voltage line. Each anti-fuse element is coupled to two word lines, one select line, and two common-voltage lines. Each anti-fuse element includes a first anti-fuse memory cell and a second anti-fuse memory cell. The first anti-fuse memory cell is coupled to the first word line, the first select line, and the first common-voltage line. The second anti-fuse memory cell is coupled to the second word line, the first select line, and the second common-voltage line.

In an embodiment of the present invention, the first anti-fuse memory cell and the second anti-fuse memory cell are arranged symmetric to each other.

In an embodiment of the present invention, the first anti-fuse memory cell and the second anti-fuse memory cell are formed in a semiconductor region having a first conductivity type. The first anti-fuse memory cell includes a first gate dielectric block, a first anti-fuse gate, a first ion doped region, a second ion doped region, and a third ion doped region. The first gate dielectric block is formed on the semiconductor region and arranged between the first word line and the semiconductor region. The first anti-fuse gate is formed on the first gate dielectric block and coupled to the first common-voltage line. The first anti-fuse gate is closer to the first common-voltage line than the first word line. The first ion doped region, the second ion doped region, and the third ion doped region, formed in the semiconductor region, has a second conductivity type opposite to the first conductivity type. The first ion doped region and the second ion doped region are respectively formed on two opposite side of the semiconductor region, which is directly arranged under the first word line. The second ion doped region and the third ion doped region are respectively formed on two opposite side of the semiconductor region, which is directly arranged under the first anti-fuse gate. The first ion doped region is coupled to the first select line.

In an embodiment of the present invention, the second anti-fuse memory cell includes a second gate dielectric block, a second anti-fuse gate, a fourth ion doped region, a fifth ion doped region, and a sixth ion doped region. The second gate dielectric block is formed on the semiconductor region and arranged between the second word line and the semiconductor region. The second anti-fuse gate is formed on the second gate dielectric block and coupled to the second common-voltage line. The second anti-fuse gate is closer to the second common-voltage line than the second word line. The fourth ion doped region, the fifth ion doped region, and the sixth ion doped region, formed in the semiconductor region, has a second conductivity type. The fourth ion doped region and the fifth ion doped region are respectively formed on two opposite side of the semiconductor region, which is directly arranged under the second word line. The fifth ion doped region and the sixth ion doped region are respectively formed on two opposite side of the semiconductor region, which is directly arranged under the second anti-fuse gate. The fourth ion doped region is coupled to the first select line.

In an embodiment of the present invention, the first conductivity type is a P type and the second conductivity type is an N type.

In an embodiment of the present invention, when the first anti-fuse memory cell is selected to perform a writing activity, the first common-voltage line is coupled to a high voltage, the first word line is coupled to the high voltage or a middle voltage, and the first select line is coupled to a grounding voltage. The high voltage is higher than the middle voltage and the middle voltage is higher than the grounding voltage.

In an embodiment of the present invention, when the first anti-fuse memory cell is not selected to perform a writing activity, the first common-voltage line is coupled to a high voltage, the first word line is coupled to a grounding voltage, and the first select line is coupled to a biasing voltage or electrically floating. The high voltage is higher than the biasing voltage and the biasing voltage is higher than the grounding voltage.

In an embodiment of the present invention, when the first anti-fuse memory cell is selected to perform a reading activity, the first common-voltage line is coupled to a grounding voltage, the first word line is coupled to a middle voltage, and the first select line is coupled to a biasing voltage. The middle voltage is higher than the biasing voltage and the biasing voltage is higher than the grounding voltage.

In an embodiment of the present invention, when the first anti-fuse memory cell is not selected to perform a reading activity, the first common-voltage line is coupled to a grounding voltage, the first word line is coupled to the grounding voltage, and the first select line is electrically floating.

In an embodiment of the present invention, when the second anti-fuse memory cell is selected to perform a writing activity, the second common-voltage line is coupled to a high voltage, the second word line is coupled to the high voltage or a middle voltage, and the first select line is coupled to a grounding voltage. The high voltage is higher than the middle voltage and the middle voltage is higher than the grounding voltage.

In an embodiment of the present invention, when the second anti-fuse memory cell is not selected to perform a writing activity, the second common-voltage line is coupled to a high voltage, the second word line is coupled to a grounding voltage, and the first select line is coupled to a biasing voltage or electrically floating. The high voltage is higher than the biasing voltage and the biasing voltage is higher than the grounding voltage.

In an embodiment of the present invention, when the second anti-fuse memory cell is selected to perform a reading activity, the second common-voltage line is coupled to a grounding voltage, the second word line is coupled to a middle voltage, and the first select line is coupled to a biasing voltage. The middle voltage is higher than the biasing voltage and the biasing voltage is higher than the grounding voltage.

In an embodiment of the present invention, when the second anti-fuse memory cell is not selected to perform a reading activity, the second common-voltage line is coupled to a grounding voltage, the second word line is coupled to the grounding voltage, and the first select line is electrically floating.

In an embodiment of the present invention, the first conductivity type is an N type and the second conductivity type is a P type.

In an embodiment of the present invention, when the first anti-fuse memory cell is selected to perform a writing activity, the first common-voltage line is coupled to a grounding voltage, the first word line is coupled to the grounding voltage or a middle voltage, and the first select line is coupled to a high voltage. The high voltage is higher than the middle voltage and the middle voltage is higher than the grounding voltage.

In an embodiment of the present invention, when the first anti-fuse memory cell is not selected to perform a writing activity, the first common-voltage line is coupled to a grounding voltage, the first word line is coupled to a high voltage, and the first select line is coupled to a biasing voltage or electrically floating. The high voltage is higher than the biasing voltage and the biasing voltage is higher than the grounding voltage.

In an embodiment of the present invention, when the first anti-fuse memory cell is selected to perform a reading activity, the first common-voltage line is coupled to a high voltage, the first word line is coupled to a middle voltage, and the first select line is coupled to a biasing voltage. The middle voltage is lower than the biasing voltage and the high voltage is higher than the biasing voltage.

In an embodiment of the present invention, when the first anti-fuse memory cell is not selected to perform a reading activity, the first common-voltage line is coupled to a high voltage, the first word line is coupled to the high voltage, and the first select line is electrically floating.

In an embodiment of the present invention, when the second anti-fuse memory cell is selected to perform a writing activity, the second common-voltage line is coupled to a grounding voltage, the second word line is coupled to the grounding voltage or a middle voltage, and the first select line is coupled to a high voltage. The high voltage is higher than the middle voltage and the middle voltage is higher than the grounding voltage.

In an embodiment of the present invention, when the second anti-fuse memory cell is not selected to perform a writing activity, the second common-voltage line is coupled to a grounding voltage, the second word line is coupled to a high voltage, and the first select line is coupled to a biasing voltage or electrically floating. The high voltage is higher than the biasing voltage and the biasing voltage is higher than the grounding voltage.

In an embodiment of the present invention, when the second anti-fuse memory cell is selected to perform a reading activity, the second common-voltage line is coupled to a high voltage, the second word line is coupled to a middle voltage, and the first select line is coupled to a biasing voltage. The middle voltage is lower than the biasing voltage and the high voltage is higher than the biasing voltage.

In an embodiment of the present invention, when the second anti-fuse memory cell is not selected to perform a reading activity, the second common-voltage line is coupled to a high voltage, the second word line is coupled to the high voltage, and the first select line is electrically floating.

In an embodiment of the present invention, the semiconductor region is a semiconductor substrate.

In an embodiment of the present invention, the semiconductor region is a doped well and the doped well is formed in a semiconductor substrate.

To sum up, the embodiments of the small-area common-voltage anti-fuse array couples the common-voltage lines together to reduce the number and the overall area of decoders.

Below, the embodiments are described in detail in cooperation with the drawings to make easily understood the technical contents, characteristics and accomplishments of the present invention.

DETAILED DESCRIPTION OF THE INVENTION

Figure 1:
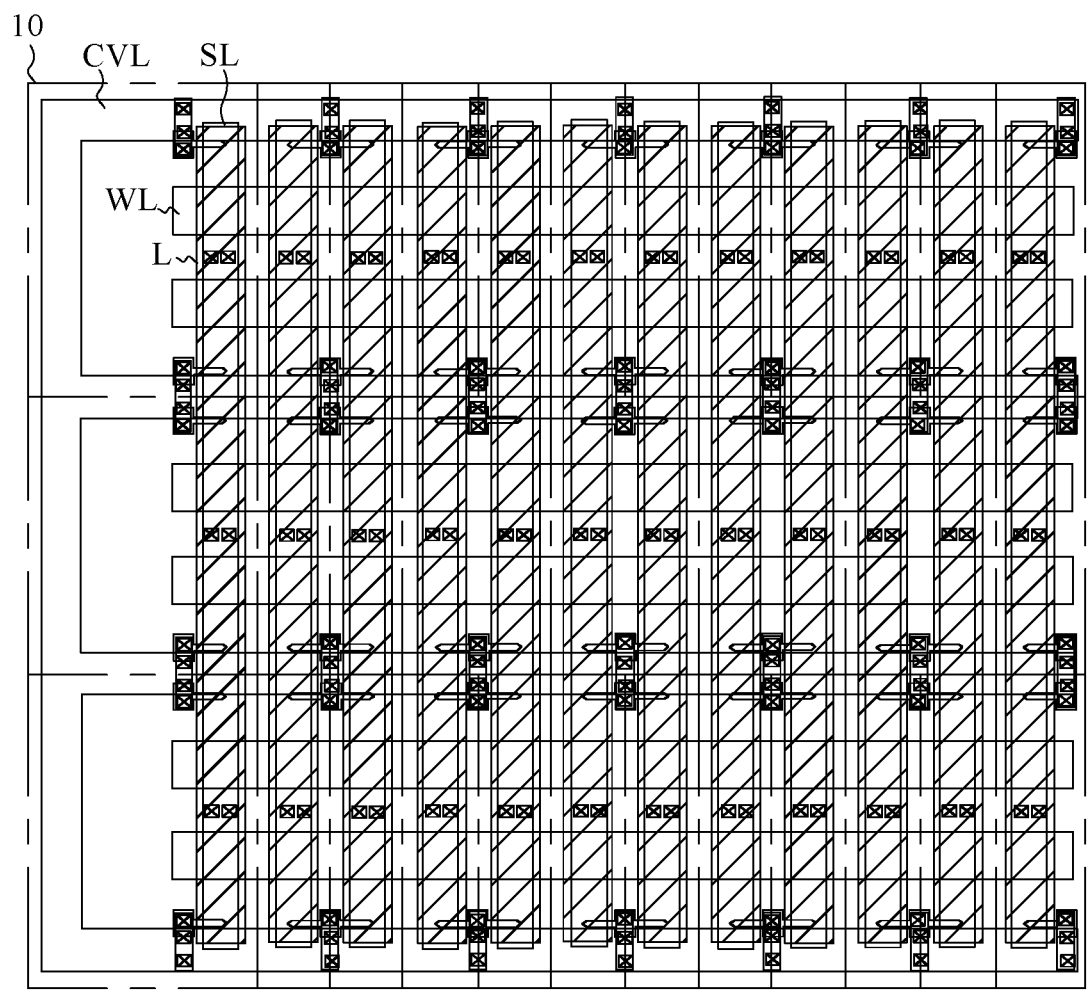
FIG. 1 is a schematic diagram illustrating the circuit layout a small-area common-voltage anti-fuse array according to an embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the present invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment.

Certain terms are used throughout the description and the claims to refer to particular components. One skilled in the art appreciates that a component may be referred to using different names. This disclosure does not intend to distinguish between components that differ in name but in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

Throughout the description and claims, it will be understood that when a component is referred to as being "positioned on," "positioned above," "connected to," "engaged with," or "coupled with" another component, it can be directly on, directly connected to, or directly engaged with the other component, or intervening component may be present. In contrast, when a component is referred to as being "directly on," "directly connected to," or "directly engaged with" another component, there are no intervening components present.

In the following description, a small-area common-voltage anti-fuse array will be provided, which couples the common-voltage lines together to reduce the number and the overall area of decoders.

Figure 2:
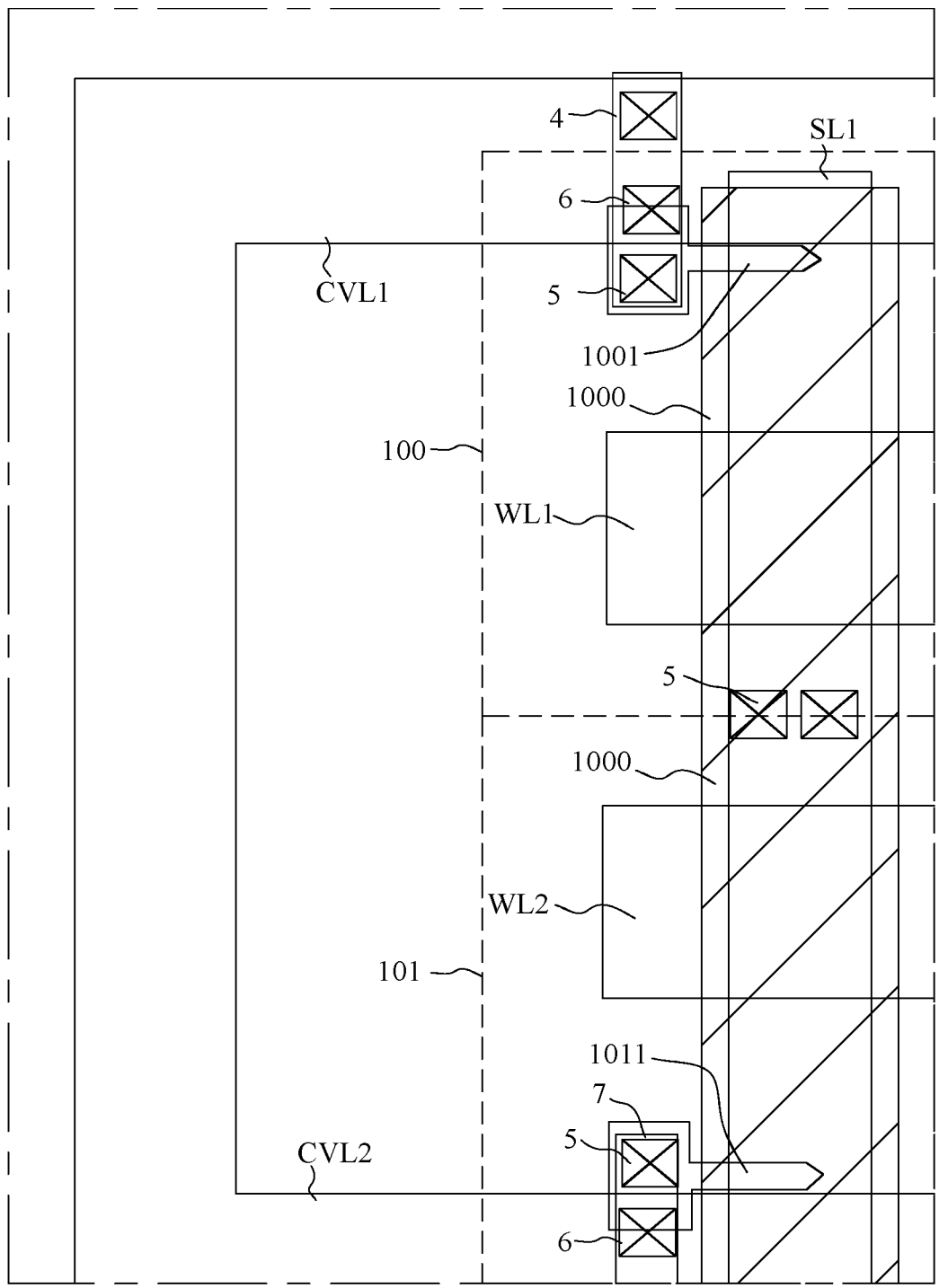
FIG. 2 is a schematic diagram illustrating the circuit layout of an anti-fuse element according to an embodiment of the present invention.

FIG. 1 is a schematic diagram illustrating the circuit layout a small-area common-voltage anti-fuse array according to an embodiment of the present invention. FIG. 2 is a schematic diagram illustrating the circuit layout of an anti-fuse element according to an embodiment of the present invention. Referring to FIG. 1 and FIG. 2, a small-area common-voltage anti-fuse array 1 of the present invention is introduced as follows. The small-area common-voltage anti-fuse array 1 includes a plurality of word lines WL arranged in parallel, a plurality of select lines SL arranged in parallel, a plurality of common-voltage lines CVL arranged in parallel, and a plurality of anti-fuse elements 10. The word lines WL includes a first word line WL1 and a second word line WL2. The word lines WL are perpendicular to the select lines SL. The select lines SL include a first select line SL1. The common-voltage lines CVL are perpendicular to the select lines SL. The ends of the common-voltage lines CVL on the same side are directly coupled together. The common-voltage lines CVL include a first common-voltage line CVL1 and a second common-voltage line CVL2. The first word line WL1 and the second word line WL2 are respectively close to the first common-voltage line CVL1 and the second common-voltage line CVL2. Each anti-fuse element 10 is coupled to two of the word lines WL, one of the select lines SL, and two of the common-voltage lines CVL. Each anti-fuse element 10 includes a first anti-fuse memory cell 100 and a second anti-fuse memory cell 101. The first anti-fuse memory cell 100 is coupled to the first word line WL1, the first select line SL1, and the first common-voltage line CVL1. The second anti-fuse memory cell 101 is coupled to the second word line WL2, the first select line SL1, and the second common-voltage line CVL2. In some embodiments of the present invention, the first anti-fuse memory cell 100 and the second anti-fuse memory cell 101 are arranged symmetric to each other.

Figure 3:
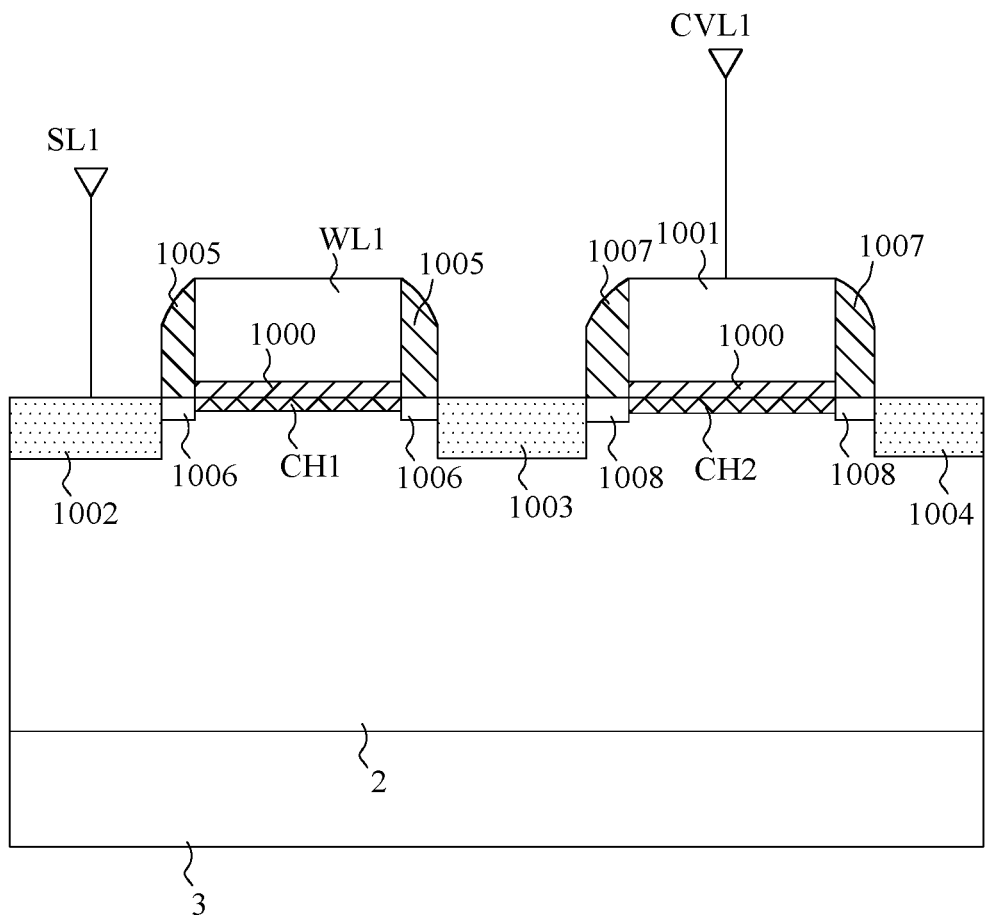
FIG. 3 is a cross-sectional view of a first anti-fuse memory cell according to an embodiment of the present invention.

FIG. 3 is a cross-sectional view of a first anti-fuse memory cell according to an embodiment of the present invention. Referring to FIG. 3 and FIG. 2, the first anti-fuse memory cell 100 is formed in a semiconductor region 2 having a first conductivity type. For example, the semiconductor region 2 is a doped well formed in a semiconductor substrate 3. The semiconductor substrate 3 may be a P-type semiconductor substrate or an N-type semiconductor substrate. The first anti-fuse memory cell 100 includes a first gate dielectric block 1000, a first anti-fuse gate 1001, a first ion doped region 1002, a second ion doped region 1003, and a third ion doped region 1004. The first gate dielectric block 1000 is a part of a gate dielectric layer L in FIG. 1. The first anti-fuse gate 1001 and the word lines WL in FIG. 1 are a part of an electrode layer. The select lines SL in FIG. 1 are a part of a first conductive metal layer. The common-voltage lines CVL in FIG. 1 are a part of a second conductive metal layer. The electrode layer, the first conductive metal layer, and the second conductive metal layer are sequentially formed from bottom to top. The first gate dielectric block 1000 is formed on the semiconductor region 2 and located between the first word line WL1 and the semiconductor region 2. The first anti-fuse gate 1001 is formed on the first gate dielectric block 1000 and coupled to the first common-voltage line CVL1. The first anti-fuse gate 1001 is closer to the first common-voltage line CVL1 than the first word line WL1. Specifically, the first anti-fuse gate 1001 overlaps a first conductive metal block 4. The first conductive metal block 4 is a part of the first conductive metal layer. There is a conduction via 5 is formed between the first anti-fuse gate 1001 and the first conductive metal block 4. The first anti-fuse gate 1001 is coupled to the first conductive metal block 4 through the conduction via 5. The first conductive metal block 4 overlaps the first common-voltage line CVL1. There is a conduction via 6 is formed between the first common-voltage line CVL1 and the first conductive metal block 4. The first conductive metal block 4 is coupled to the first common-voltage line CVL1 through the conduction via 6.

The first ion doped region 1002, the second ion doped region 1003, and the third ion doped region 1004, formed in the semiconductor region 2, has a second conductivity type opposite to the first conductivity type. The first ion doped region 1002 and the second ion doped region 1003 are respectively formed on two opposite side of the semiconductor region 2, which is directly arranged under the first word line WL1. The second ion doped region 1003 and the third ion doped region 1004 are respectively formed on two opposite side of the semiconductor region 2, which is directly arranged under the first anti-fuse gate 1001. The first ion doped region 1002 is coupled to the first select line SL1. The first select line SL1 is coupled to the conduction via 5 formed directly under the first select line SL1. The conduction via 5 penetrates through the gate dielectric layer L. The first select line SL1 is coupled to an external voltage through the conduction via 5.

The semiconductor region 2, the first word line WL1, the first ion doped region 1002, the second ion doped region 1003, and the first gate dielectric block 1000 form a first select metal-oxide-semiconductor field effect transistor. The two sidewalls of the first word line WL1 are respectively provided with two first sidewall spacers 1005 that extend to the sidewall of the first gate dielectric block 1000. There are two first lightly-doped drains (LDDs) 1006 which are directly respectively formed under the two first sidewall spacers 1005. The first LDDs 1006 have the second conductivity type. When the first select metal-oxide-semiconductor field effect transistor is turned on, a channel region CH1 is formed between the first LDDs 1006.

The semiconductor region 2, the first anti-fuse gate 1001, the second ion doped region 1003, the third ion doped region 1004, and the first gate dielectric block 1000 form a first anti-fuse metal-oxide-semiconductor field effect transistor. The two sidewalls of the first anti-fuse gate 1001 are respectively provided with two second sidewall spacers 1007 that extend to the sidewall of the first gate dielectric block 1000. There are two second lightly-doped drains (LDDs) 1008 which are directly respectively formed under the two second sidewall spacers 1007. The second LDDs 1008 have the second conductivity type. When the first anti-fuse metal-oxide-semiconductor field effect transistor is turned on, a channel region CH2 is formed between the second LDDs 1008.

Figure 4:
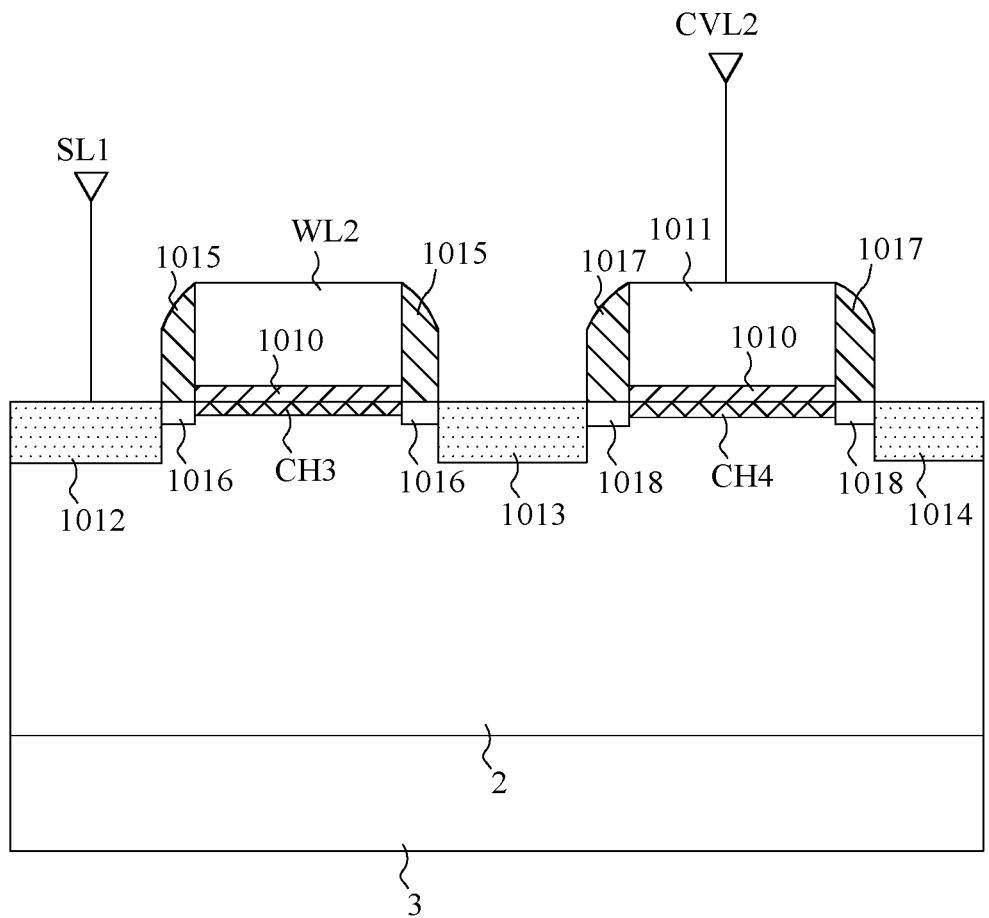
FIG. 4 is a cross-sectional view of a second anti-fuse memory cell according to an embodiment of the present invention.

FIG. 4 is a cross-sectional view of a second anti-fuse memory cell according to an embodiment of the present invention. Referring to FIG. 4 and FIG. 2, the second anti-fuse memory cell 101 is formed in the semiconductor region 2. The second anti-fuse memory cell 101 includes a second gate dielectric block 1010, a second anti-fuse gate 1011, a fourth ion doped region 1012, a fifth ion doped region 1013, and a sixth ion doped region 1014. The second gate dielectric block 1010 is a part of the gate dielectric layer L in FIG. 1. The second anti-fuse gate 1011 and the word lines WL in FIG. 1 are a part of an electrode layer. The second gate dielectric block 1010 is formed on the semiconductor region 2 and located between the second word line WL2 and the semiconductor region 2. The second anti-fuse gate 1011 is formed on the second gate dielectric block 1010 and coupled to the second common-voltage line CVL2. The second anti-fuse gate 1011 is closer to the second common-voltage line CVL2 than the second word line WL2. Specifically, the second anti-fuse gate 1011 overlaps a second conductive metal block 7. The second conductive metal block 7 is a part of the first conductive metal layer. The conduction via 5 is formed between the second anti-fuse gate 1011 and the second conductive metal block 7. The second anti-fuse gate 1011 is coupled to the second conductive metal block 7 through the conduction via 5. The second conductive metal block 7 overlaps the second common-voltage line CVL2. The conduction via 6 is formed between the second common-voltage line CVL2 and the second conductive metal block 7. The second conductive metal block 7 is coupled to the second common-voltage line CVL2 through the conduction via 6.

The fourth ion doped region 1012, the fifth ion doped region 1013, and the sixth ion doped region 1014, formed in the semiconductor region 2, has the second conductivity type. The fourth ion doped region 1012 and the fifth ion doped region 1013 are respectively formed on two opposite side of the semiconductor region 2, which is directly arranged under the second word line WL2. The fifth ion doped region 1013 and the sixth ion doped region 1014 are respectively formed on two opposite side of the semiconductor region 2, which is directly arranged under the second anti-fuse gate 1011. The fourth ion doped region 1012 is coupled to the first select line SL1.

The semiconductor region 2, the second word line WL2, the fourth ion doped region 1012, the fifth ion doped region 1013, and the second gate dielectric block 1010 form a second select metal-oxide-semiconductor field effect transistor. The two sidewalls of the second word line WL2 are respectively provided with two third sidewall spacers 1015 that extend to the sidewall of the second gate dielectric block 1010. There are two third lightly-doped drains (LDDs) 1016 which are directly respectively formed under the two third sidewall spacers 1015. The third LDDs 1016 have the second conductivity type. When the second select metal-oxide-semiconductor field effect transistor is turned on, a channel region CH3 is formed between the third LDDs 1016.

The semiconductor region 2, the second anti-fuse gate 1011, the fifth ion doped region 1013, the sixth ion doped region 1014, and the second gate dielectric block 1010 form a second anti-fuse metal-oxide-semiconductor field effect transistor. The two sidewalls of the second anti-fuse gate 1011 are respectively provided with two fourth sidewall spacers 1017 that extend to the sidewall of the second gate dielectric block 1010. There are two fourth lightly-doped drains (LDDs) 1018 which are directly respectively formed under the two fourth sidewall spacers 1017. The fourth LDDs 1018 have the second conductivity type. When the second anti-fuse metal-oxide-semiconductor field effect transistor is turned on, a channel region CH4 is formed between the fourth LDDs 1018.

Assume that the first conductivity type is a P type and that the second conductivity type is an N type.

When the first anti-fuse memory cell 100 is selected to perform a writing activity, the first common-voltage line CVL1 is coupled to a high voltage, the first word line WL1 is coupled to the high voltage or a middle voltage, and the first select line SL1 is coupled to a grounding voltage. The high voltage is higher than the middle voltage and the middle voltage is higher than the grounding voltage. When the first anti-fuse memory cell 100 is not selected to perform a writing activity, the first common-voltage line CVL1 is coupled to a high voltage, the first word line WL1 is coupled to a grounding voltage, and the first select line SL1 is coupled to a first biasing voltage or electrically floating. The high voltage is higher than the first biasing voltage and the first biasing voltage is higher than the grounding voltage. When the first anti-fuse memory cell 100 is selected to perform a reading activity, the first common-voltage line CVL1 is coupled to a grounding voltage, the first word line WL1 is coupled to a middle voltage, and the first select line SL1 is coupled to a first biasing voltage. The middle voltage is higher than the first biasing voltage and the first biasing voltage is higher than the grounding voltage. When the first anti-fuse memory cell 100 is not selected to perform a reading activity, the first common-voltage line CVL1 is coupled to a grounding voltage, the first word line WL1 is coupled to the grounding voltage, and the first select line SL1 is electrically floating.

When the second anti-fuse memory cell 101 is selected to perform a writing activity, the second common-voltage line CVL2 is coupled to a high voltage, the second word line WL2 is coupled to the high voltage or a middle voltage, and the first select line SL1 is coupled to a grounding voltage. The high voltage is higher than the middle voltage and the middle voltage is higher than the grounding voltage. When the second anti-fuse memory cell 101 is not selected to perform a writing activity, the second common-voltage line CVL2 is coupled to a high voltage, the second word line WL2 is coupled to a grounding voltage, and the first select line SL1 is coupled to a first biasing voltage or electrically floating. The high voltage is higher than the first biasing voltage and the first biasing voltage is higher than the grounding voltage. When the second anti-fuse memory cell 101 is selected to perform a reading activity, the second common-voltage line CVL2 is coupled to a grounding voltage, the second word line WL2 is coupled to a middle voltage, and the first select line SL1 is coupled to a first biasing voltage. The middle voltage is higher than the first biasing voltage and the first biasing voltage is higher than the grounding voltage. When the second anti-fuse memory cell 101 is not selected to perform a reading activity, the second common-voltage line CVL2 is coupled to a grounding voltage, the second word line WL2 is coupled to the grounding voltage, and the first select line SL1 is electrically floating.

Based on the forgoing operation, the common-voltage lines are directly coupled to an external voltage without penetrating through decoders and directly coupled to the anti-fuse memory cells. Accordingly, the anti-fuse memory cells perform a writing activity or a reading activity to reduce the number of decoders and the overall area of the small-area common-voltage anti-fuse array. In the forgoing operation, applying a middle voltage or a high voltage to the word line will affect the current of the device. Thus, a middle voltage or a high voltage is applied to the word line according to different designs and conditions. The select lines are biased or electrically floating depending on process characteristics. In addition, the high voltage is higher than the middle voltage and the middle voltage is higher than the first biasing voltage. The high voltage is usually slightly lower than the drain-to-source breakdown voltage. Specifically, the high voltage is equal to the drain-to-source breakdown voltage minus the threshold voltage of the field effect transistor and the middle voltage is equal to the drain-to-source breakdown voltage×0.5.

Assume that the first conductivity type is an N type and that the second conductivity type is a P type.

When the first anti-fuse memory cell 100 is selected to perform a writing activity, the first common-voltage line CVL1 is coupled to a grounding voltage, the first word line WL1 is coupled to the grounding voltage or a middle voltage, and the first select line SL1 is coupled to a high voltage. The high voltage is higher than the middle voltage and the middle voltage is higher than the grounding voltage. When the first anti-fuse memory cell 100 is not selected to perform a writing activity, the first common-voltage line CVL1 is coupled to a grounding voltage, the first word line WL1 is coupled to a high voltage, and the first select line SL1 is coupled to a second biasing voltage or electrically floating. The high voltage is higher than the second biasing voltage and the second biasing voltage is higher than the grounding voltage. When the first anti-fuse memory cell 100 is selected to perform a reading activity, the first common-voltage line CVL1 is coupled to a high voltage, the first word line WL1 is coupled to a middle voltage, and the first select line SL1 is coupled to a second biasing voltage. The middle voltage is lower than the second biasing voltage and the high voltage is higher than the second biasing voltage. When the first anti-fuse memory cell 100 is not selected to perform a reading activity, the first common-voltage line CVL1 is coupled to a high voltage, the first word line WL1 is coupled to the high voltage, and the first select line SL1 is electrically floating.

When the second anti-fuse memory cell 101 is selected to perform a writing activity, the second common-voltage line CVL2 is coupled to a grounding voltage, the second word line WL2 is coupled to the grounding voltage or a middle voltage, and the first select line SL1 is coupled to a high voltage. The high voltage is higher than the middle voltage and the middle voltage is higher than the grounding voltage. When the second anti-fuse memory cell 101 is not selected to perform a writing activity, the second common-voltage line CVL2 is coupled to a grounding voltage, the second word line WL2 is coupled to a high voltage, and the first select line SL1 is coupled to a second biasing voltage or electrically floating. The high voltage is higher than the second biasing voltage and the second biasing voltage is higher than the grounding voltage. When the second anti-fuse memory cell 101 is selected to perform a reading activity, the second common-voltage line CVL2 is coupled to a high voltage, the second word line WL2 is coupled to a middle voltage, and the first select line SL1 is coupled to a second biasing voltage. The middle voltage is lower than the second biasing voltage and the high voltage is higher than the second biasing voltage. When the second anti-fuse memory cell 101 is not selected to perform a reading activity, the second common-voltage line CVL2 is coupled to a high voltage, the second word line WL2 is coupled to the high voltage, and the first select line SL1 is electrically floating.

Based on the forgoing operation, the common-voltage lines are directly coupled to an external voltage without penetrating through decoders and directly coupled to the anti-fuse memory cells. Accordingly, the anti-fuse memory cells perform a writing activity or a reading activity to reduce the number of decoders and the overall area of the small-area common-voltage anti-fuse array. In the forgoing operation, applying a middle voltage or a grounding voltage to the word line will affect the current of the device. Thus, a middle voltage or a grounding voltage is applied to the word line according to different designs and conditions. The select lines are biased or electrically floating depending on process characteristics. In addition, the high voltage is higher than the second biasing voltage and the second biasing voltage is higher than the middle voltage. The high voltage is usually slightly lower than the source-to-drain breakdown voltage. Specifically, the high voltage is equal to the source-to-drain breakdown voltage plus the threshold voltage of the field effect transistor and the middle voltage is equal to the source-to-drain breakdown voltage×0.5.

Figure 5:
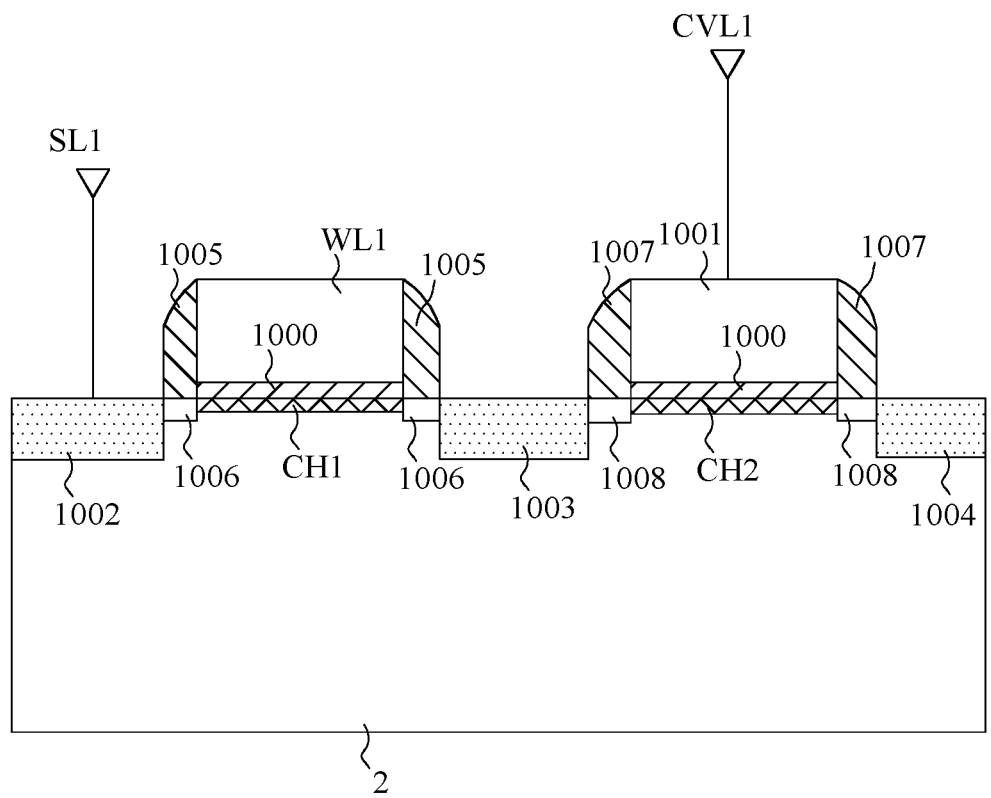
FIG. 5 is a cross-sectional view of a first anti-fuse memory cell according to another embodiment of the present invention.
Figure 6:
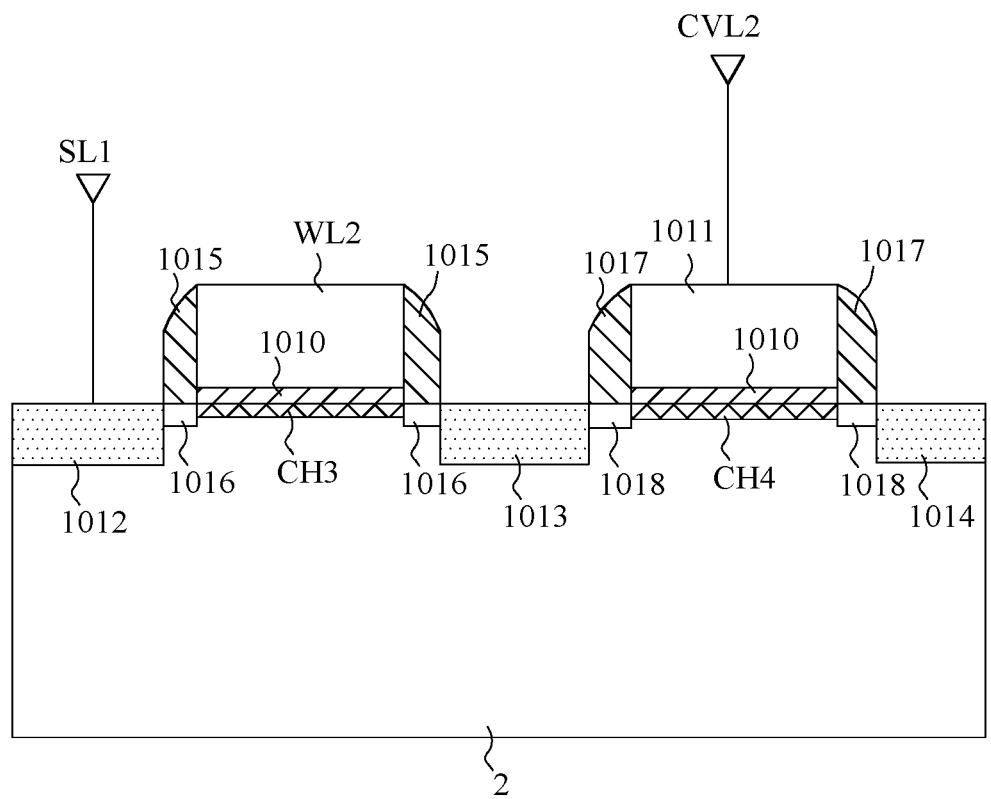
FIG. 6 is a cross-sectional view of a second anti-fuse memory cell according to another embodiment of the present invention.

FIG. 5 is a cross-sectional view of a first anti-fuse memory cell according to another embodiment of the present invention. FIG. 6 is a cross-sectional view of a second anti-fuse memory cell according to another embodiment of the present invention. Referring to FIG. 5 and FIG. 6, the first anti-fuse memory cell 100 and the second anti-fuse memory cell 101 are formed in the semiconductor region 2 implemented with a semiconductor substrate. The other structures of the first anti-fuse memory cell 100 and the second anti-fuse memory cell 101 have been described previously so it will not be reiterated.

According to the embodiments provided above, the small-area common-voltage anti-fuse array couples the common-voltage lines together to reduce the number of decoders and the overall area of the small-area common-voltage anti-fuse array.

The embodiments described above are only to exemplify the present invention but not to limit the scope of the present invention. Therefore, any equivalent modification or variation according to the shapes, structures, features, or spirit disclosed by the present invention is to be also included within the scope of the present invention.

What is claimed is:

1. A small-area common-voltage anti-fuse array comprising:
   a plurality of word lines, arranged in parallel, comprising a first word line and a second word line;
   a plurality of select lines arranged in parallel, wherein the plurality of select lines perpendicular to the plurality of word lines comprise a first select line;
   a plurality of common-voltage lines arranged in parallel, wherein the plurality of common-voltage lines perpendicular to the plurality of select lines are directly coupled together, the plurality of common-voltage lines comprise a first common-voltage line and a second common-voltage line, and the first word line and the second word line are respectively close to the first common-voltage line and the second common-voltage line; and
   a plurality of anti-fuse elements each coupled to two of the plurality of word lines, one of the plurality of select lines, and two of the plurality of common-voltage lines, wherein each of the plurality of anti-fuse elements comprises:
      a first anti-fuse memory cell coupled to the first word line, the first select line, and the first common-voltage line; and
      a second anti-fuse memory cell coupled to the second word line, the first select line, and the second common-voltage line.

2. The small-area common-voltage anti-fuse array according to claim 1, wherein the first anti-fuse memory cell and the second anti-fuse memory cell are arranged symmetric to each other.

3. The small-area common-voltage anti-fuse array according to claim 2, wherein the first anti-fuse memory cell and the second anti-fuse memory cell are formed in a semiconductor region having a first conductivity type, and the first anti-fuse memory cell comprises:
   a first gate dielectric block formed on the semiconductor region and arranged between the first word line and the semiconductor region;
   a first anti-fuse gate formed on the first gate dielectric block and coupled to the first common-voltage line, wherein the first anti-fuse gate is closer to the first common-voltage line than the first word line; and
   a first ion doped region, a second ion doped region, and a third ion doped region, formed in the semiconductor region, having a second conductivity type opposite to the first conductivity type, wherein the first ion doped region and the second ion doped region are respectively formed on two opposite side of the semiconductor region, which is directly arranged under the first word line, the second ion doped region and the third ion doped region are respectively formed on two opposite side of the semiconductor region, which is directly arranged under the first anti-fuse gate, and the first ion doped region is coupled to the first select line.

4. The small-area common-voltage anti-fuse array according to claim 3, wherein the second anti-fuse memory cell comprises:
   a second gate dielectric block formed on the semiconductor region and arranged between the second word line and the semiconductor region;
   a second anti-fuse gate formed on the second gate dielectric block and coupled to the second common-voltage line, wherein the second anti-fuse gate is closer to the second common-voltage line than the second word line; and
   a fourth ion doped region, a fifth ion doped region, and a sixth ion doped region, formed in the semiconductor region, having a second conductivity type, wherein the fourth ion doped region and the fifth ion doped region are respectively formed on two opposite side of the semiconductor region, which is directly arranged under the second word line, the fifth ion doped region and the sixth ion doped region are respectively formed on two opposite side of the semiconductor region, which is directly arranged under the second anti-fuse gate, and the fourth ion doped region is coupled to the first select line.

5. The small-area common-voltage anti-fuse array according to claim 4, wherein the first conductivity type is a P type and the second conductivity type is an N type.

6. The small-area common-voltage anti-fuse array according to claim 5, wherein when the first anti-fuse memory cell is selected to perform a writing activity, the first common-voltage line is coupled to a high voltage, the first word line is coupled to the high voltage or a middle voltage, and the first select line is coupled to a grounding voltage, the high voltage is higher than the middle voltage, and the middle voltage is higher than the grounding voltage.

7. The small-area common-voltage anti-fuse array according to claim 5, wherein when the first anti-fuse memory cell is not selected to perform a writing activity, the first common-voltage line is coupled to a high voltage, the first word line is coupled to a grounding voltage, and the first select line is coupled to a biasing voltage or electrically floating, the high voltage is higher than the biasing voltage, and the biasing voltage is higher than the grounding voltage.

8. The small-area common-voltage anti-fuse array according to claim 5, wherein when the first anti-fuse memory cell is selected to perform a reading activity, the first common-voltage line is coupled to a grounding voltage, the first word line is coupled to a middle voltage, and the first select line is coupled to a biasing voltage, the middle voltage is higher than the biasing voltage, and the biasing voltage is higher than the grounding voltage.

9. The small-area common-voltage anti-fuse array according to claim 5, wherein when the first anti-fuse memory cell is not selected to perform a reading activity, the first common-voltage line is coupled to a grounding voltage, the first word line is coupled to the grounding voltage, and the first select line is electrically floating.

10. The small-area common-voltage anti-fuse array according to claim 5, wherein when the second anti-fuse memory cell is selected to perform a writing activity, the second common-voltage line is coupled to a high voltage, the second word line is coupled to the high voltage or a middle voltage, and the first select line is coupled to a grounding voltage, the high voltage is higher than the middle voltage, and the middle voltage is higher than the grounding voltage.

11. The small-area common-voltage anti-fuse array according to claim 5, wherein when the second anti-fuse memory cell is not selected to perform a writing activity, the second common-voltage line is coupled to a high voltage, the second word line is coupled to a grounding voltage, and the first select line is coupled to a biasing voltage or electrically floating, the high voltage is higher than the biasing voltage, and the biasing voltage is higher than the grounding voltage.

12. The small-area common-voltage anti-fuse array according to claim 5, wherein when the second anti-fuse memory cell is selected to perform a reading activity, the second common-voltage line is coupled to a grounding voltage, the second word line is coupled to a middle voltage, and the first select line is coupled to a biasing voltage, the middle voltage is higher than the biasing voltage, and the biasing voltage is higher than the grounding voltage.

13. The small-area common-voltage anti-fuse array according to claim 5, wherein when the second anti-fuse memory cell is not selected to perform a reading activity, the second common-voltage line is coupled to a grounding voltage, the second word line is coupled to the grounding voltage, and the first select line is electrically floating.

14. The small-area common-voltage anti-fuse array according to claim 4, wherein the first conductivity type is an N type and the second conductivity type is a P type.

15. The small-area common-voltage anti-fuse array according to claim 14, wherein when the first anti-fuse memory cell is selected to perform a writing activity, the first common-voltage line is coupled to a grounding voltage, the first word line is coupled to the grounding voltage or a middle voltage, and the first select line is coupled to a high voltage, the high voltage is higher than the middle voltage, and the middle voltage is higher than the grounding voltage.

16. The small-area common-voltage anti-fuse array according to claim 14, wherein when the first anti-fuse memory cell is not selected to perform a writing activity, the first common-voltage line is coupled to a grounding voltage, the first word line is coupled to a high voltage, and the first select line is coupled to a biasing voltage or electrically floating, the high voltage is higher than the biasing voltage, and the biasing voltage is higher than the grounding voltage.

17. The small-area common-voltage anti-fuse array according to claim 14, wherein when the first anti-fuse memory cell is selected to perform a reading activity, the first common-voltage line is coupled to a high voltage, the first word line is coupled to a middle voltage, and the first select line is coupled to a biasing voltage, the middle voltage is lower than the biasing voltage, and the high voltage is higher than the biasing voltage.

18. The small-area common-voltage anti-fuse array according to claim 14, wherein when the first anti-fuse memory cell is not selected to perform a reading activity, the first common-voltage line is coupled to a high voltage, the first word line is coupled to the high voltage, and the first select line is electrically floating.

19. The small-area common-voltage anti-fuse array according to claim 14, wherein when the second anti-fuse memory cell is selected to perform a writing activity, the second common-voltage line is coupled to a grounding voltage, the second word line is coupled to the grounding voltage or a middle voltage, and the first select line is coupled to a high voltage, the high voltage is higher than the middle voltage, and the middle voltage is higher than the grounding voltage.

20. The small-area common-voltage anti-fuse array according to claim 14, wherein when the second anti-fuse memory cell is not selected to perform a writing activity, the second common-voltage line is coupled to a grounding voltage, the second word line is coupled to a high voltage, and the first select line is coupled to a biasing voltage or electrically floating, the high voltage is higher than the biasing voltage, and the biasing voltage is higher than the grounding voltage.

21. The small-area common-voltage anti-fuse array according to claim 14, wherein when the second anti-fuse memory cell is selected to perform a reading activity, the second common-voltage line is coupled to a high voltage, the second word line is coupled to a middle voltage, and the first select line is coupled to a biasing voltage, the middle voltage is lower than the biasing voltage, and the high voltage is higher than the biasing voltage.

22. The small-area common-voltage anti-fuse array according to claim 14, wherein when the second anti-fuse memory cell is not selected to perform a reading activity, the second common-voltage line is coupled to a high voltage, the second word line is coupled to the high voltage, and the first select line is electrically floating.

23. The small-area common-voltage anti-fuse array according to claim 4, wherein the semiconductor region is a semiconductor substrate.

24. The small-area common-voltage anti-fuse array according to claim 4, wherein the semiconductor region is a doped well and the doped well is formed in a semiconductor substrate.

\* \* \* \* \*